United States Patent

Hirata

[11] Patent Number: 6,118,704
[45] Date of Patent: Sep. 12, 2000

[54] ERASING DEVICE AND METHOD OF ERASURE FOR A STORAGE UNIT, AND STORAGE MEDIUM STORING PROGRAM FOR ERASING STORAGE UNIT

[75] Inventor: Masayoshi Hirata, Tokyo, Japan

[73] Assignee: NEC Corporation, Tokyo, Japan

[21] Appl. No.: 09/321,592

[22] Filed: May 28, 1999

[30] Foreign Application Priority Data

Jun. 1, 1998 [JP] Japan .................................. 10-151759

[51] Int. Cl.$^7$ .................................................. G11C 16/04
[52] U.S. Cl. ................................. 365/185.24; 365/185.29
[58] Field of Search ........................ 365/185.24, 185.29, 365/185.3, 185.33

[56] References Cited

U.S. PATENT DOCUMENTS

| | | | |
|---|---|---|---|
| 5,327,383 | 7/1994 | Merchant et al. | 365/218 |
| 5,475,249 | 12/1995 | Watsuji et al. | 365/189.07 |
| 5,600,593 | 2/1997 | Fong | 365/185.19 |
| 5,625,600 | 4/1997 | Hong | 365/218 |
| 5,781,477 | 7/1998 | Rinerson et al. | 365/185.29 |
| 5,831,905 | 11/1998 | Hirano | 365/185.29 |

*Primary Examiner*—Andrew Tran
*Assistant Examiner*—Anh Phung
*Attorney, Agent, or Firm*—Sughrue, Mion, Zinn, Macpeak & Seas, PLLC

[57] ABSTRACT

In an erasing device or method for a storage unit, or a storage medium storing a program for erasing the storage unit, an output VS of a column decoder and a reference voltage VR are compared at a sense amplifier, while an erase operation is executed by taking out an electric charge of each cell in a memory cell array, after which the output of the sense amplifier is evaluated at a data determination circuit, and a signal DD is counted by a bit counter under the condition of VS<VR. As the entirety of addresses of an address signal ADD from an internal address increment circuit are finished, a signal FG rises. When a count number of a bit counter is above a predetermined number, an erasing routine is terminated, and thus it is possible to prevent the majority of the bits from falling into a state of depression.

9 Claims, 10 Drawing Sheets

ERASING DEVICE AND METHOD OF ERASURE FOR A STORAGE UNIT, AND STORAGE MEDIUM STORING PROGRAM FOR ERASING STORAGE UNIT

BACKGROUND OF THE INVENTION

The present invention relates to erasing device and method of a storage unit such as a flash memory etc., and to a storage medium storing a program for erasing the storage unit, which automatically erases stored content in the storage unit.

DESCRIPTION OF THE RELATED ART

Figure 1:
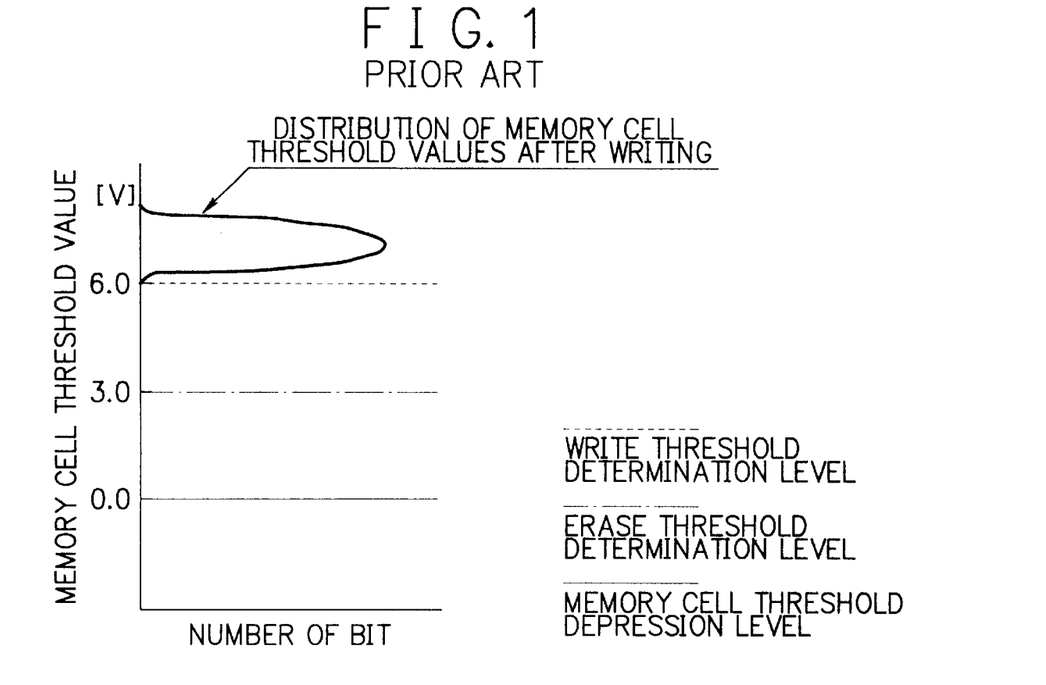
FIG. 1 is a characteristic diagram showing a distribution of threshold values of memory cells after write in a conventional erasing device.
Figure 2:
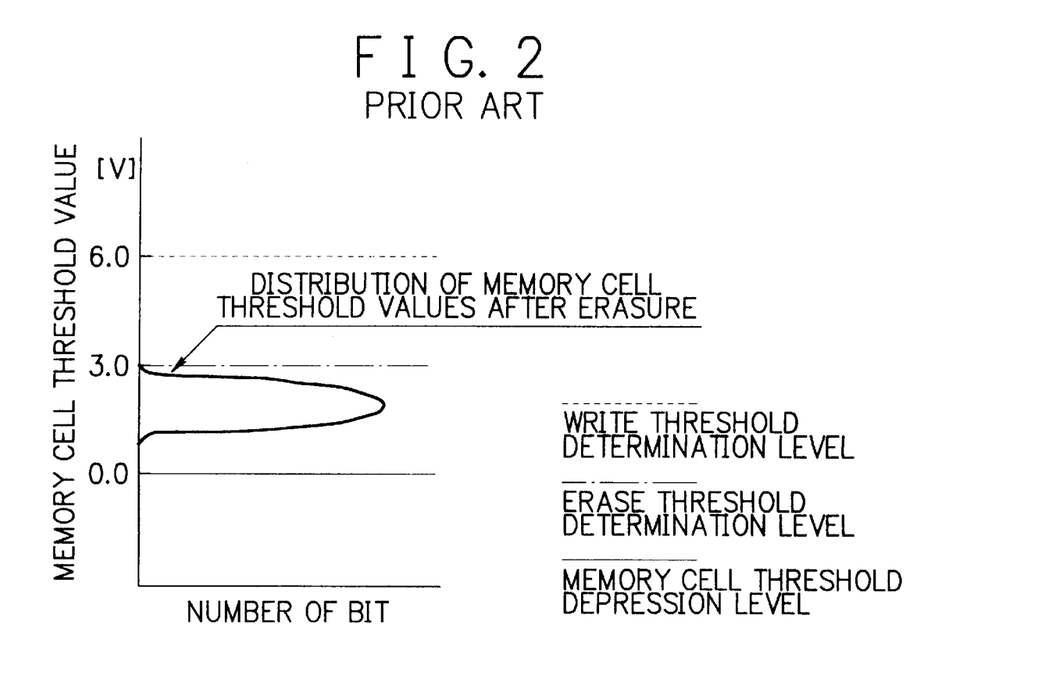
FIG. 2 is a characteristic diagram showing a distribution of threshold values of memory cells after erasure in the conventional erasing device.

In accordance with a conventional automatic erasing method in a flash memory, in cases when there is no defective bit in the memory cells, changes in threshold values will take place as shown in FIGS. 1 and 2. In the beginning, threshold values of the all of the memory cells are automatically arranged at a threshold level after writing. In FIG. 1, the threshold level of the all of the memory cells are pulled up to be over a write threshold determination level, for instance, over 6v.

Now as to an erasing process, as shown in FIG. 2, the memory cells are to be erased until the threshold values of the all of the fall below an erase threshold determination level, for example, below 3v. Storage unit erasure is usually accomplished by repetition of this operation.

Figure 3:
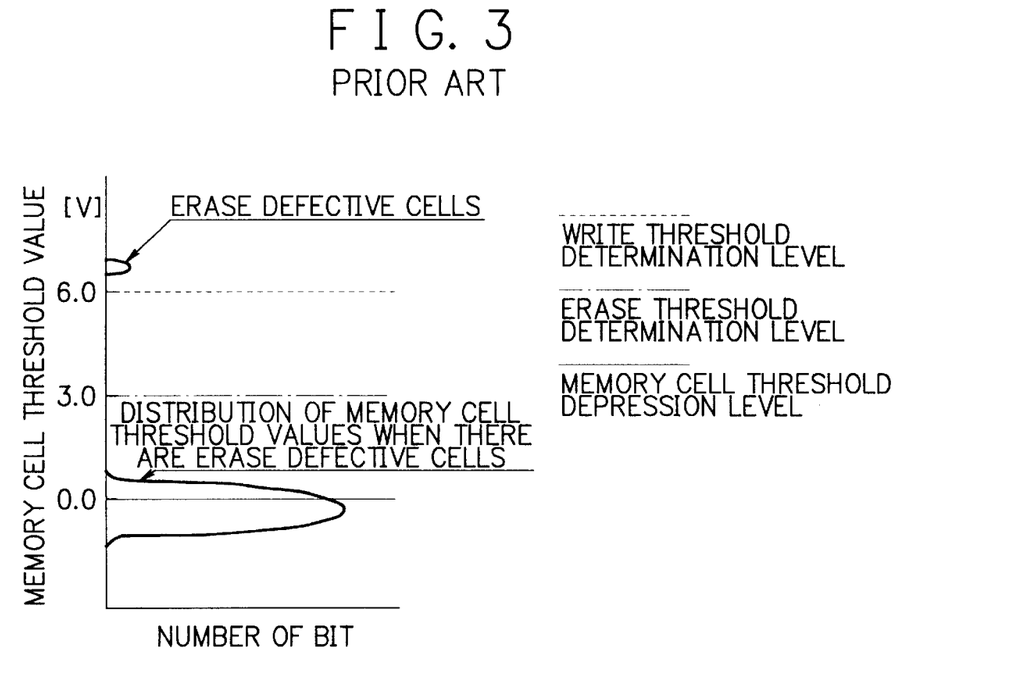
FIG. 3 is a characteristic diagram showing a distribution of threshold values of memory cells when there are erase-defective cells in the conventional erasing device.

On the contrary, when there are erase-defective bits in some memory cells, the erasing condition will become as shown in FIG. 3. When there are erase-defective cells which do not fall bellow the erase threshold determination level (3v), the flash memory under automatic erase operation will determine that erasing is not yet completed, and thus will keep on erasing. Consequently, in most memory cells, the threshold level becomes below 0v, meaning that the memory cells fall into a state of depression. In such state where there are depression cells on the bit lines, normal reading becomes difficult at a time of reading.

Figure 4:
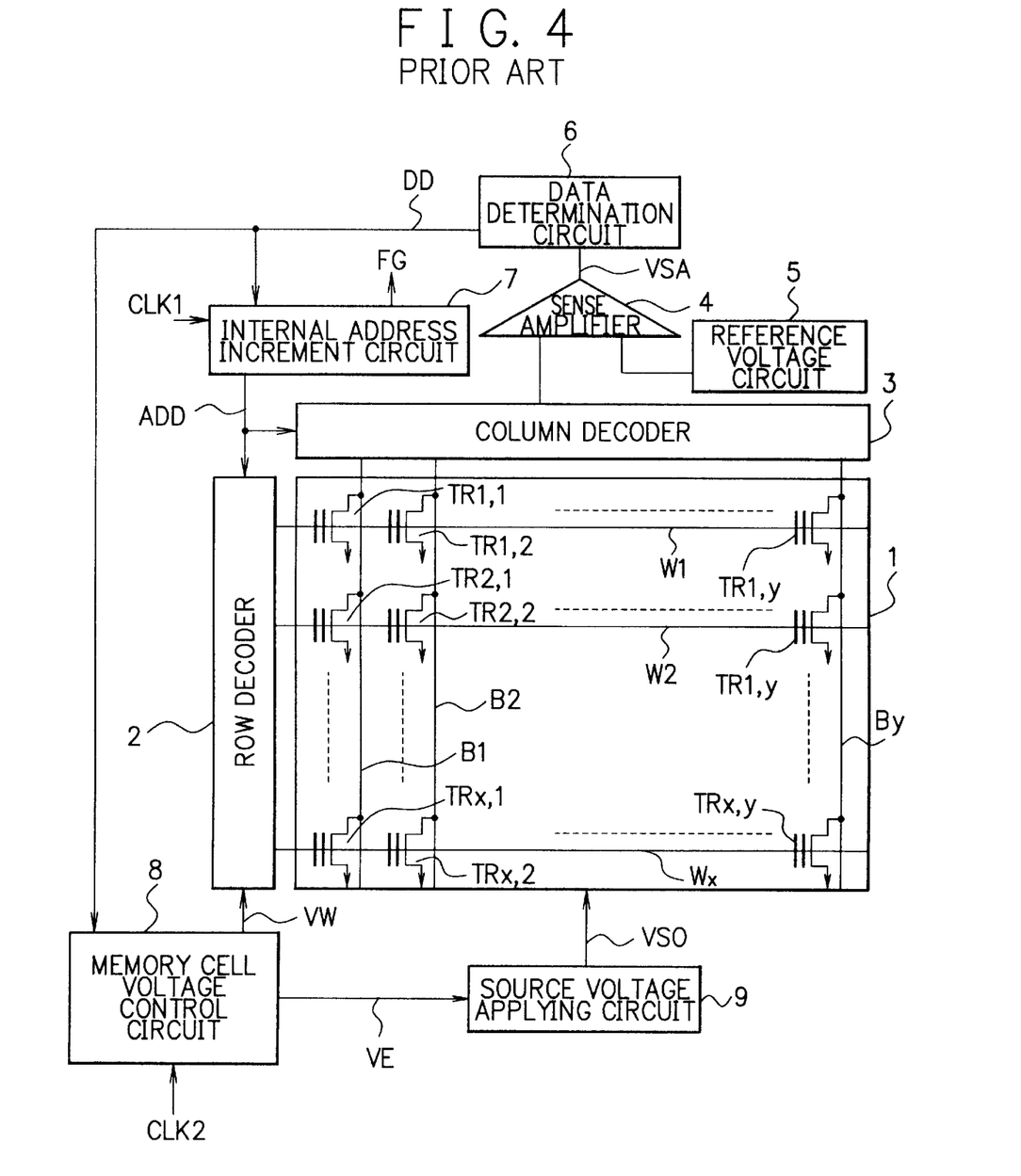
FIG. 4 is a structural diagram of the conventional erasing device.

FIG. 4 is a diagram showing a structure of a conventional erasing device of a flash memory.

The erasing device comprises a memory cell array 1 including transistors TR1,1, TR1,2, . . . TRx,y, serving as memory cells; a row decoder 2 for decoding word lines (W1, W2, . . . Wx); a column decoder 3 for decoding bit lines (B1, B2, . . . By); a sense amplifier 4 for detecting data (threshold level) of memory cells; a reference voltage generator 5 for generating a reference voltage VR of the sense amplifier 4; a data determination circuit 6 for determining whether or not the data being read is of an expected value; a memory cell voltage control circuit 8 for controlling a memory cell voltage; and a source voltage applying circuit 9 for determining whether or not a voltage is to be applied to source terminals of the memory cells upon receiving a signal VE from the memory cell voltage control circuit 8.

Figure 5:
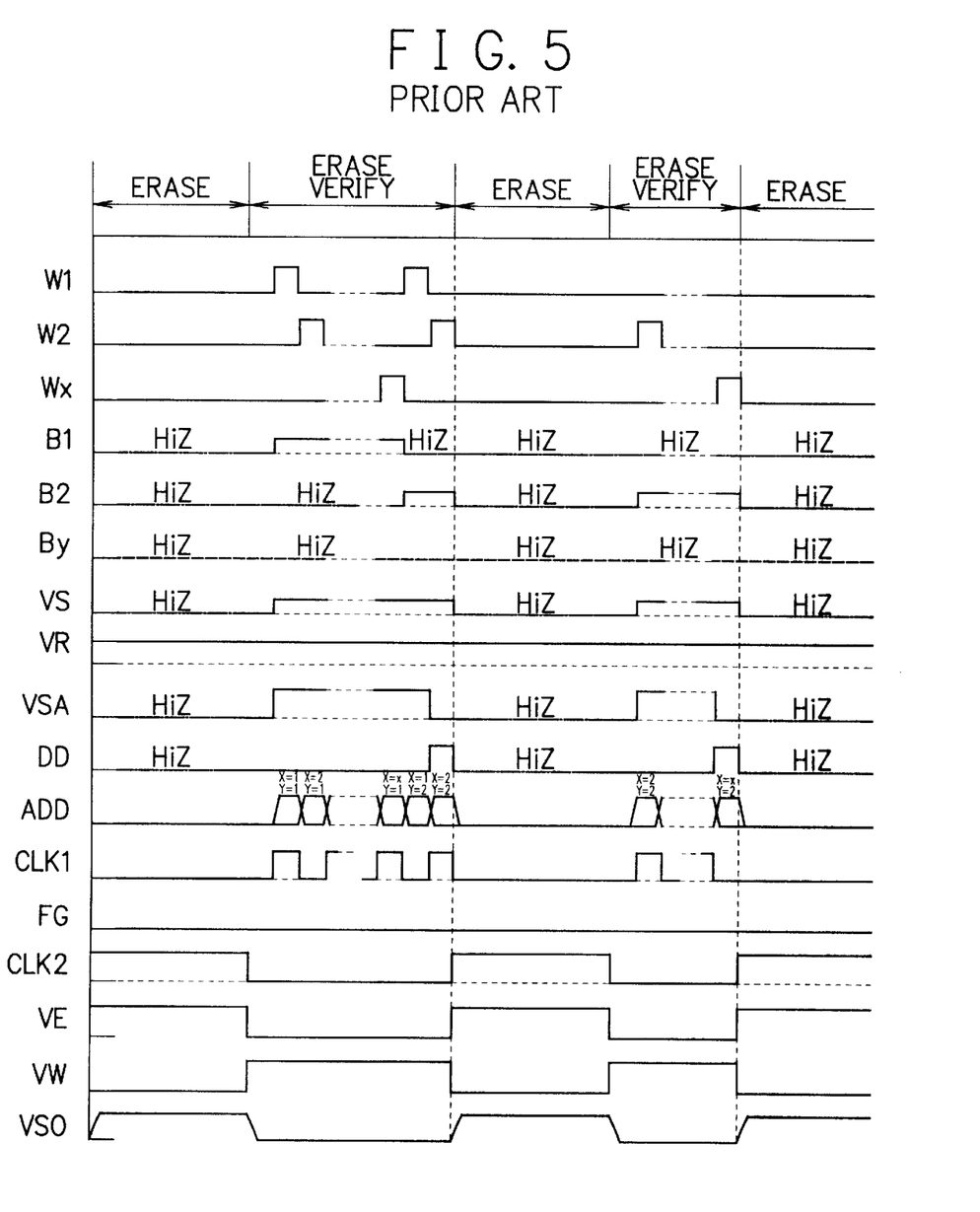
FIG. 5 is a timing chart showing an operation of the conventional erasing device.

Now an operation of the conventional erasing device will be described with reference to a timing waveform chart as shown in FIG. 5.

First, regarding an erase operation of a flash memory, an erase operation adopting a source erase system will be described. The left end of the chart illustrates timing waveforms at a time of memory cell erasing. The word lines (W1, W2, . . . Wx) are all 0v, the bit lines (B1, B2, . . . By) are open, and the sense amplifier 4 is not operating, and therefore, signals VS, VSA, and DD are indeterminate, while signals ADD, CLK 1 and FG are of the initial value, and a signal VE is determined by a signal CLK2 which controls the erasing timing so as to be outputted to the source voltage applying circuit 9.

The source voltage applying circuit 9 applies an erasing voltage VSO to source terminals of the memory cells by the signal VE. signal VW is generated from the signal CLK2 as in the case of the signal VE, and it is used for a word line voltage control by the row decoder 2, which brings all the word lines to become 0v. In this occasion, a high voltage is applied to the source terminals of the memory cells, and electrons are taken out from floating gates of the memory cells, which causes the threshold values of the memory cells to fall down.

Now a routine for measuring the threshold values of the erased memory cells in the conventional case will be described. Here, timing waveforms in erase verify intervals shown in FIG. 5 will be referred to. First, the ward lines rise in turn starting from W1, W2, . . . and so on. Among the bit lines, the one where reading is conducted is raised, and when the reading is completed in the word direction, the following bit line is raised for reading. At this time, the signal VS is of a drain voltage of the memory cell, and by comparing it with the signal VR, a threshold value of a memory cell is discovered. The data being determined by the sense amplifier circuit 4 is outputted as the signal VSA, and compared with the expected value in the data determination circuit 6, so as to be outputted as the signal DD. In this case, the expected value in the data determination circuit 6 is low, which is taken from the signal VSA and EXOR logic. When the address signal ADD becomes the last address X=x, Y=y, the signal FG rises at an internal address increment circuit 7, which terminates the erasing routine.

In the erasing device as shown in the above conventional example, by addressing the all of the memory cells with the internal address increment circuit 7, it is determined whether the erase operation is completed or not. Specifically, with reference to FIG. 5, in the erasing status at the left end of the figure, erase voltage is applied to the source terminals of the whole memory cells. Now with respect to erase verify, the address signal ADD indicates the address of the memory cell array in due order. In this case, the address is increased from x=1, y=1 to x=2, y=2. The signal DD rises when x=2, y=2, which indicates that the erasing status in the subject memory cell is incomplete. Therefore, the automatic erase operation moves on to the next erasing state, and once again the source voltage will be applied to the source terminals of the all of the memory cells. In the next erase verify, a verification will start from x=2, y=2, and will be repeated over and over again until the address becomes the last address. Consequently, as mentioned above, in a case when there is any erase-defective memory cell, or a case when any erase-defective cell has been generated in the middle of the application, it is possible that the erasing state will occur many times. As a result, most of the memory cells will fall to a depression state, which eventually induces failure in reading.

SUMMARY OF THE INVENTION

It is therefore an object of the present invention to solve the above-mentioned problems, and to provide an erasing device and a method, of a storage unit such as a flash memory etc., having a function of automatically repeating the erase operation on the memory cells, and a storage medium storing a program for erasing the cells of the storage unit, which are capable of preventing a great majority of memory cells from falling into a state of depression to keep them at a desired value, even in cases when there are erase-defective bits while conducting an erase operation in the storage unit.

In accordance with a first aspect of the present invention, there is provided an erasing device of a storage unit comprising: an erasing means repeatedly erasing memory cells on the storage unit; and a controlling means, when the memory cells are being erased by the erasing means, terminating the memory cell erasure by the erasing means when each of the threshold values of a predetermined number of bits, which are fewer in number than the number of the all of the bits of the memory cells, becomes smaller than a predetermined threshold value.

In accordance with a second aspect of the present invention, there is provided an erasing device of a storage unit as illustrated in the first aspect, comprising a selecting means for selecting the predetermined number of bits of the memory cells.

In accordance with a third aspect of the present invention, there is provided an erasing device of a storage unit as illustrated in the second aspect, wherein the selecting means is to select particular bit lines or particular word lines within the memory cells.

In accordance with a fourth aspect of the present invention, there is provided an erasing method of a storage unit, comprising the steps of: repeatedly erasing memory cells on the storage unit; and controlling, when the memory cells are being erased at the step of erasing, to terminate the memory cell erasure at the step of erasing when each of the threshold values of a predetermined number of bits, which are fewer in number than the number of the whole bits of the memory cells, becomes smaller than a predetermined threshold value.

In accordance with a fifth aspect of the present invention, there is provided an erasing method of a storage unit as illustrated in the fourth aspect, comprising the step of selecting the predetermined number of bits of the memory cells.

In accordance with a sixth aspect of the present invention, there is provided an erasing method of a storage unit as illustrated in the fifth aspect, wherein, at the step of selecting, particular bit lines or particular word lines within the memory cells are selected.

In accordance with a seventh aspect of the present invention, there is provided a storage medium storing a program, in which the program executes an erasing process for repeatedly erasing memory cells on a storage unit, and a controlling process, when the memory cells are being erased by the erasing process, for terminating the memory cell erasure by the erasing process when each of the threshold values of a predetermined number of bits which are fewer number than the number of the whole bits of the memory cells, becomes smaller than a predetermined threshold value.

In accordance with an eighth aspect of the present invention, there is provided a storage medium storing a program, as illustrated in the seventh aspect, wherein a selecting process is executed for selecting the predetermined number of bits of the memory cells.

In accordance with a ninth aspect of the present invention, there is provided a storage medium storing a program, as illustrated in the eighth aspect, wherein the selecting process is executed for selecting particular bit lines or particular word lines within the memory cells.

BRIEF DESCRIPTION OF THE DRAWINGS

The above and further objects and the novel features of the invention will more fully appear from the following detailed description when the same is read in connection with the accompanying drawings, in which.

DESCRIPTION OF THE PREFERRED EMBODIMENTS

Referring now to the drawings, a description of preferred embodiments of the present invention will be given in detail.

Figure 6:
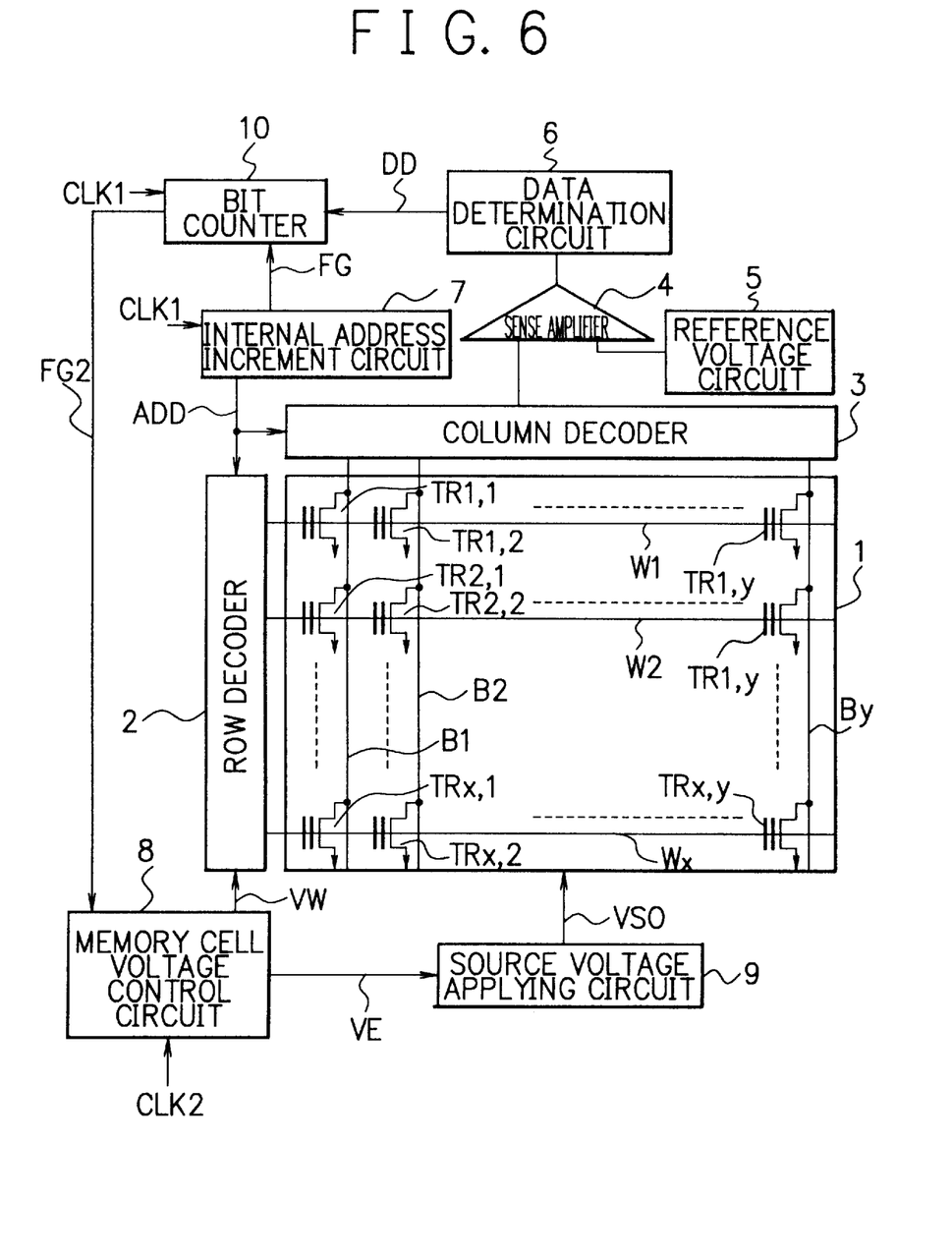
FIG. 6 is a structural diagram showing a first embodiment of an erasing device of a storage unit in accordance with the present invention.

FIG. 6 is a diagram showing a first embodiment of the present invention. The structure as shown is basically the same as the conventional erasing device, except that it has a bit counter 10. Further, with respect to FIG. 6 and FIG. 4, the same numerical codes are used for the same constituents.

The erasing device comprises a memory cell array 1 including transistors TR1,1, TR1,2, . . . TRx,y, serving as memory cells; a row decoder 2 for decoding word lines (W, W2, . . . Wx); a column decoder 3 for decoding bit lines (B1, B2, . . . By); a sense amplifier 4 for detecting data (threshold level) of memory cells; a reference voltage generator 5 for generating a reference voltage VR of the sense amplifier 4; a data determination circuit 6 for determining whether or not the data being read is of an expected value; a memory cell voltage control circuit 8 for controlling a memory cell voltage; a source voltage applying circuit 9 for determining whether or not a voltage is to be applied to a source terminal of a memory cell upon receiving a signal VE from the memory cell voltage control circuit 8; and a bit counter 10 for counting the number of bits on the basis of the determination signal from the data determination circuit 6.

The bit counter 10 is arranged such that a signal DD from the data determination circuit 6 and a signal FG from an internal address increment circuit 7 are added. Then as a signal FG2 rises from the bit counter 10, voltage supply to the memory cells by the memory cell voltage control circuit 8 is terminated and thus the erase operation is controlled to stop.

In accordance with the present embodiment, an electrically erasable programmable nonvolatile memory (to be referred to as a flash memory hereafter) having a function of repeatedly erasing memory cells by automatic erasing, is provided with a control function in which a voluntary number of bits (memory cells) in less number than the number of all of the bits (memory cells) are selected, such that in cases when the threshold values of the voluntary number of bits are smaller than the predetermined threshold value, the erase operation is terminated.

In FIG. 6, during the erase operation, the sense amplifier 4 determines whether or not the threshold values of the memory cells are erased to become below a predetermined level of voltage. The determination signal DD is inputted to the bit counter 10 from the data determination circuit 6, and when the data suggests a desired value, i.e. an erasing state, the bit counter 10 counts up for each clock CLK1. Furthermore, the clock CLK1 operates the internal address increment circuit 7 so as to increase the addresses of the memory cells in due order. In this occasion, when an address signal ADD indicates the last address of the memory cells, the signal FG being the last address flag rises.

When the signal FG rises, the bit counter 10 determines whether or not the count number is larger than the predetermined number. When the count number is larger than the predetermined number, the signal FG2 rises, and the erasing operation is terminated. In this manner, in accordance with the present invention, the memory cells being erased is counted up until the count number comes to a predetermined bit number, so as to execute an erasing evaluation.

Therefore, even when there are erase-defective memory cells, a majority of the memory cells are erased up to the predetermined memory cell threshold value, and the erase operation terminated. In the conventional method, however, unless the whole memory cells are not erased up to the predetermined memory cell threshold value, the erasing routine will continue endlessly, resulting in bringing down the threshold values of most of the memory cells below 0v, i.e. to a state of depression, which might cause failure in the next write operation. In the present embodiment, however, such a problem is, and the presence of some defective bits would not affect an operability of the device.

Figure 7:
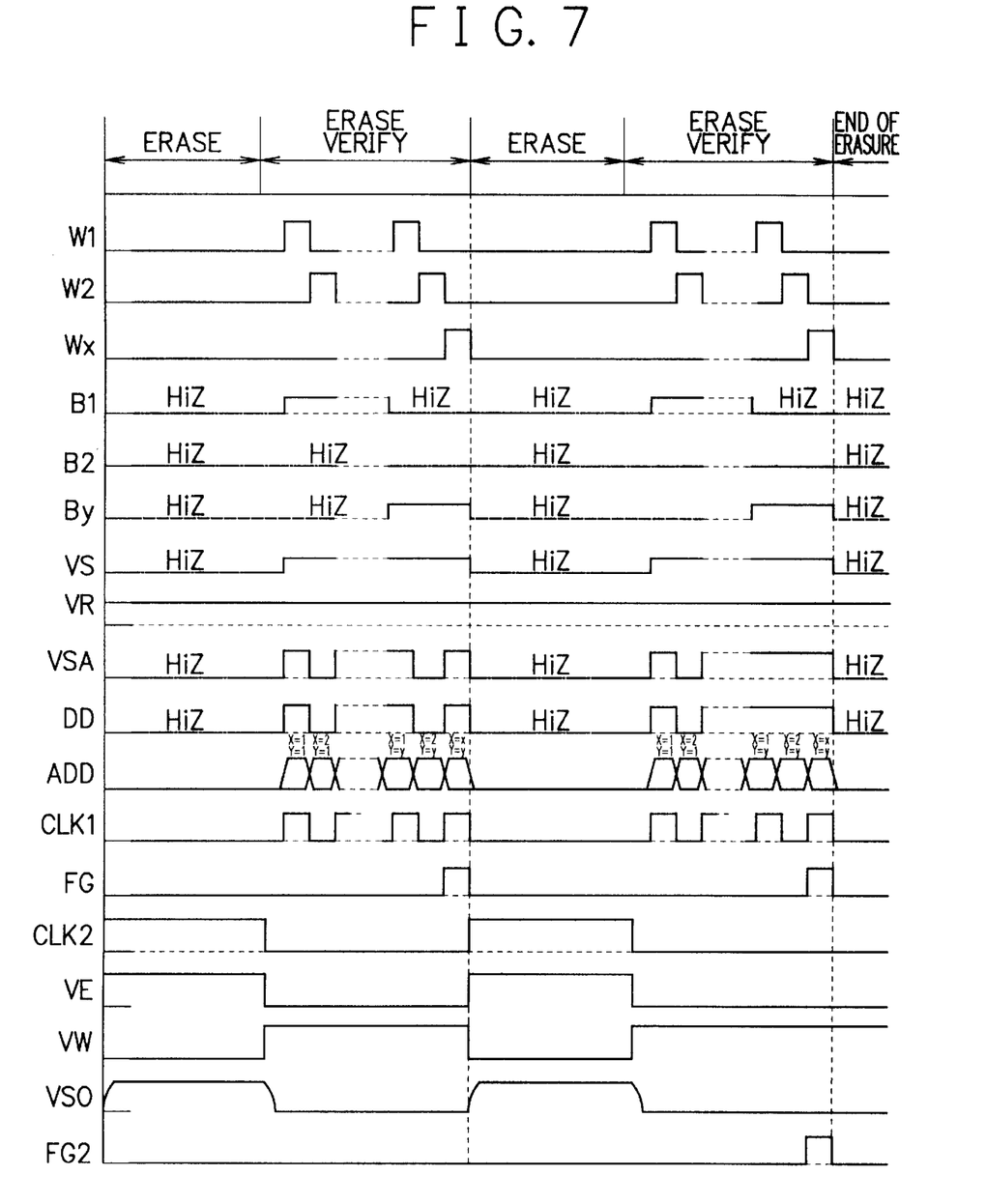
FIG. 7 is a timing chart showing an operation in the first embodiment of the present invention.

Now an operation of the erasing device as shown in FIG. 6 will be described with reference to a timing waveform chart as shown in FIG. 7.

First, regarding an erase operation of a flash memory, in the present embodiment, an erase operation adopting a source erase system will be described. The left end of the chart in FIG. 7 illustrates timing waveforms at a time of erasing. The word lines (W1, W2, . . . Wx) are all 0v, the bit lines (B1, B2, . . . By) are open, and the sense amplifier 4 is not operating, and therefore, signals VS, VSA, and DD are indeterminate, signals ADD, CLK 1 and FG are of the initial value, and a signal VE is determined by a signal CLK2 which controls the erasing timing so as to be outputted to the source voltage applying circuit 9.

The source voltage applying circuit 9 applies an erasing voltage VSO to source terminals of the memory cells by the signal VE. A signal VW is generated from the signal CLK2 as in the case of the signal VE, and it is used for a word line voltage control by the row decoder 2, which brings all the word lines to become 0v. In this occasion, a high voltage is applied to the source terminals of the memory cells, and electrons are taken out from floating gates of the memory cells, which causes the threshold values of the memory cells to fall down.

Now a routine for measuring the threshold values of the erase memory cells in the conventional case will be described. Here, timing waveforms in erase verify intervals shown in FIG. 7 will be referred to. First, the word lines rise in turn starting from W1, W2, . . . and so on. Among the bit lines, the one where reading is conducted is raised, and when the reading is completed in the word direction, the following bit line is raised for reading. At this time, the signal VS is of a drain voltage of the memory cell, and by comparing it with the signal VR, a threshold value of the memory cell is discovered. The data being determined by the sense amplifier circuit 4 is outputted as the signal VSA, compared by the expected value in the data determination circuit 6, so as to be outputted as the signal DD. In this case, the expected value in the data determination circuit 6 is low, which is taken from the signal VSA and EXOR logic.

When the address signal ADD becomes the last address X=x, Y=y, the signal FG rises at an internal address increment circuit 7, in response to which the bit counter 10 is to check whether or not the count number is over a predetermined number. When the count number is over the predetermined number, the signal FG2 rises, and is inputted to the memory cell voltage control circuit 8, in response to which the erasing routine is terminated.

As is described above, in accordance with the present embodiment, the electrically erasable programmable nonvolatile memory having a function of repeatedly erasing memory cells by automatic erasing, is capable of terminating the erase operation in cases when the threshold values of the voluntary number of bits, which are fewer in number than the number of the whole bits, are smaller than the predetermined value. Consequently, in the present embodiment, the following effects can be obtained.

Figure 8:
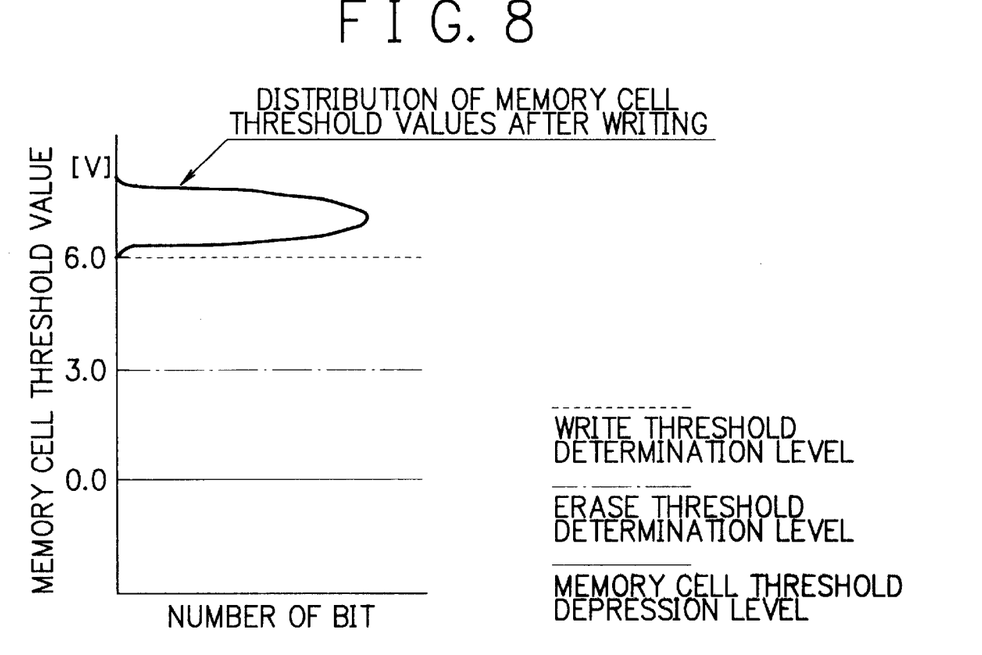
FIG. 8 is a characteristic diagram showing a distribution of threshold values of memory cells after write in the first embodiment of the present invention.
Figure 9:
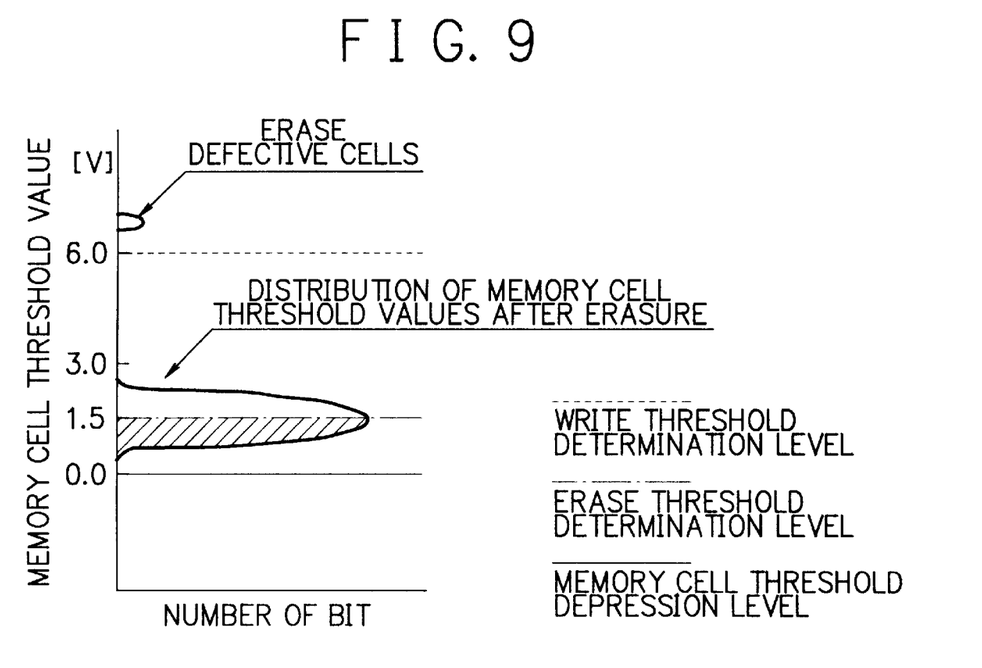
FIG. 9 is a characteristic diagram showing a distribution of threshold values of memory cells after erasure in the first embodiment of the present invention.

FIG. 8 shows a distribution of threshold values of the memory cells before erasure, where the threshold values are distributed above the write threshold determination level 6.0 V. The following explanation is on a case where the erase threshold determination level is being set to 1.5V, and the bit count number of the memory cells is set to half the number of the whole bits. In this case, the average in the distribution of threshold values of the erased memory cells will coincide for the most part with the half the number of the whole bits. Therefore, the average erase threshold level would become approximately 1.5V. In the erasing method of the present embodiment, the whole bits of the memory cells are not supposed to be evaluated to become below 1.5V. Therefore, even when there are some erase-defective bit cells as shown in FIG. 9, the threshold values of the memory cells in the main part of the distribution can be controlled to be maintained at a desired value.

According to the above-mentioned operation, the threshold values of most of the memory cells become below 1.5V, even when some erase defective bits are generated at a time of repeat evaluation. Accordingly, the automatic erasing routine would come to an end normally. In this way, even in the state of some erase defective bits being generated, the evaluation repeat can be continuously executed. Therefore, the present invention is capable of being used as a memory product where there can be some erase-defective bits.

Next a second embodiment of the invention will be described. Basically, the second embodiment is the same as the conventional erasing device as shown in FIG. 4 in terms of structure. The only difference would be that the address increase at the internal address increment circuit 7 is in the row (X) direction only, while the column (Y) direction is fixed.

Figure 10:
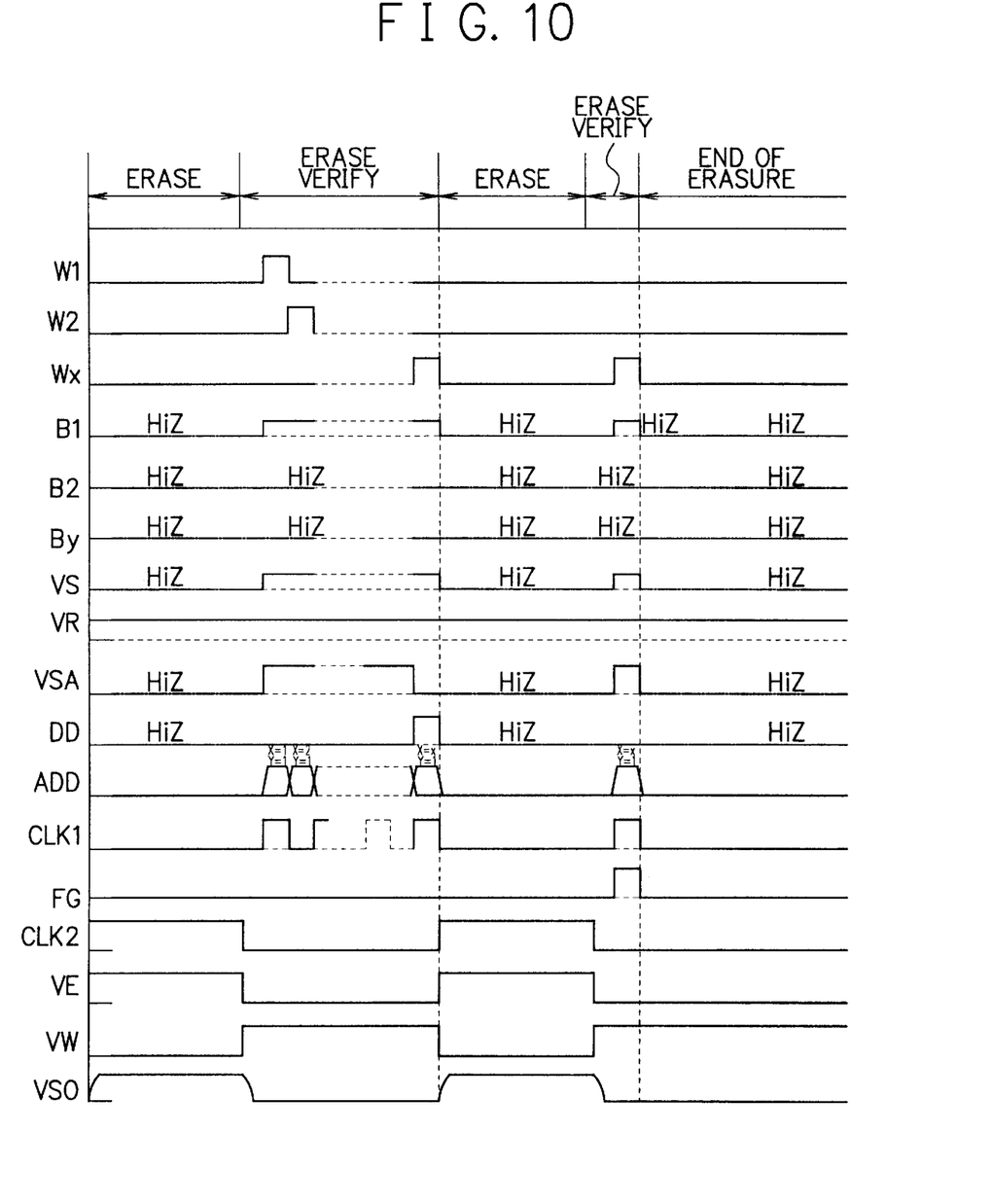
FIG. 10 is a timing chart showing an operation in a second embodiment of the present invention.

A timing waveform in the second embodiment is shown in FIG. 10. The basic operation is as explained in the first embodiment and the conventional example. However, since the address increase is performed in the row (X) direction only, the address increase is terminated in the second erase verify, in response to which the erase operation is finished.

Figure 11:
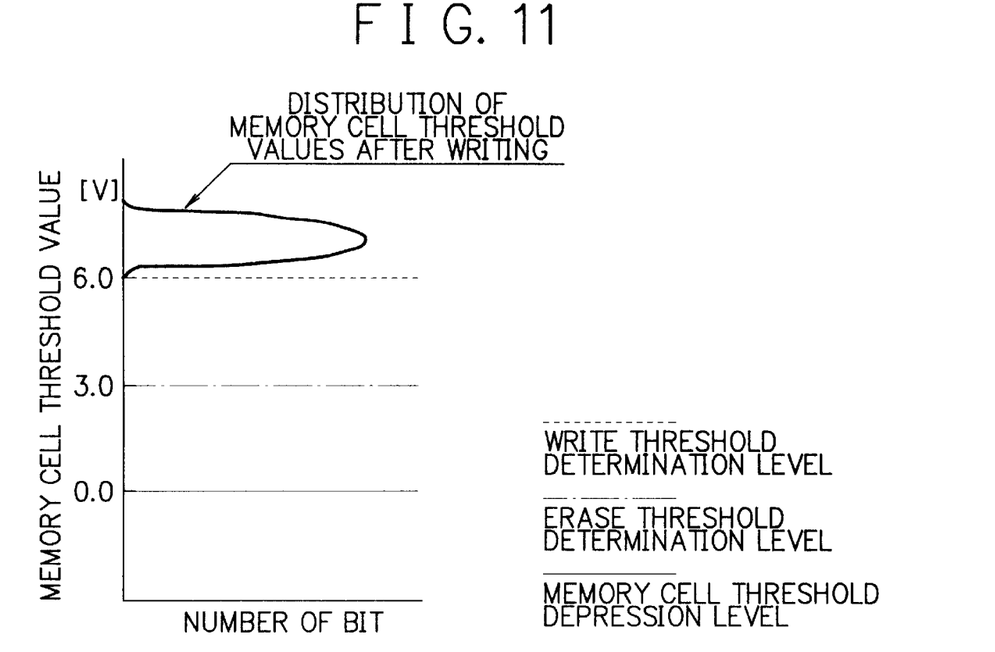
FIG. 11 is a characteristic diagram showing a distribution of threshold values of memory cells after write in the second embodiment of the present invention.
Figure 12:
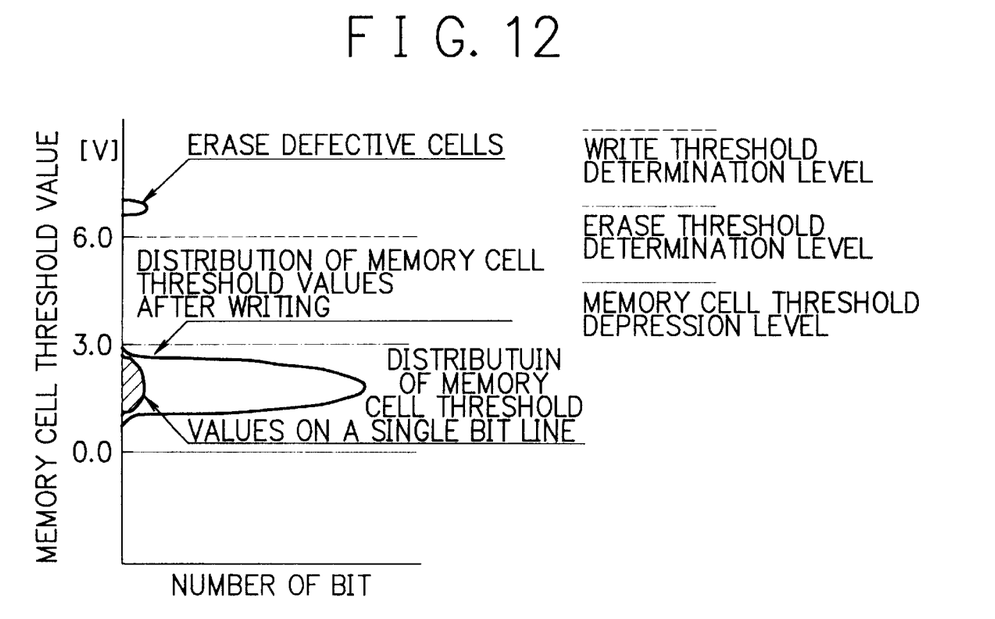
FIG. 12 is a characteristic diagram showing a distribution of threshold values of memory cells after erasure in the second embodiment of the present invention.

FIG. 11 and FIG. 12 show distribution of threshold values of the memory cells before and after erasure in the second embodiment. With reference to FIG. 12, since the distribution of threshold values of the memory cells after erasure correspond to the memory cells on a single bit line only, the distribution would be the part shaded with diagonal lines. Therefore, the same kinds of effects as in the first embodiment can be obtained in the second embodiment as well, by monitoring the distribution of threshold values of the memory cells on a single bit line, without having to monitor the distribution of threshold values of the entirety of memory cells. In this case however, when there are some erase defective cells or when some erase-defective cells are generated on a single bit line, the threshold values of most of the memory cells will fall into a state of depression. A chance of such an event happening is one-in-whatever the number of the all of the bit lines.

Figure 13:
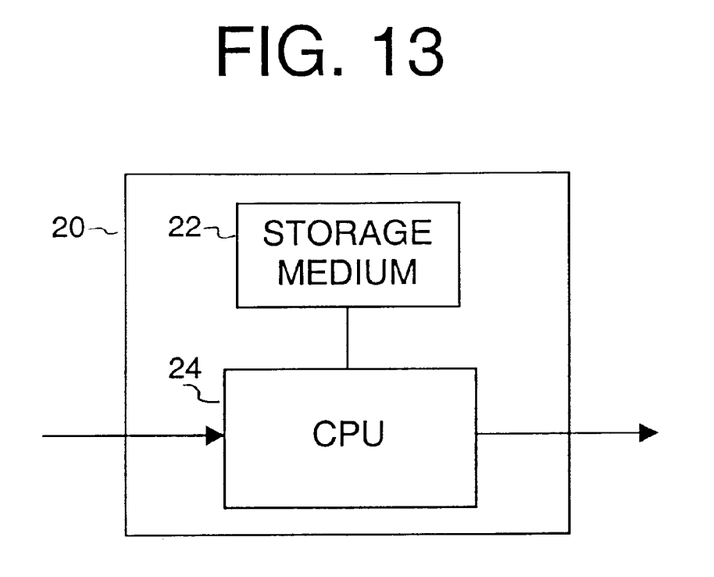
FIG. 13 is a computer system used as a circuit part of the erasing device, in palce of a 'hard' circuit, in the seventh and eighth embodiments of the present invention.

Furthermore, as illustrated in FIG. 13, each circuit part constituting the devices shown in FIG. 6 and FIG. 4 can be a hard circuit or a computer system. In a case of employing a computer system 20 a ROM for storing a program for controlling the above described operation by a CPU 24 used by the system constructs a storage medium 22 of the present invention. As to such a storage medium, 22 it is possible to use a semiconductor memory, an optical disc, a magneto-optical disc, a magnetic recording medium, etc.

As is proved in the above description, the present invention is constructed in such a way that when threshold values of a predetermined number of bits are smaller than the predetermined threshold value, the erase operation is terminated. Therefore, even when there are some erase-defective bits or when some erase-defective bits are generated, it is possible to maintain the threshold values of the memory cells in the main distribution part at a desired value. Accordingly, in cases when there are erase-defective bits during a repetition of the erase operation, threshold values of most of the memory cells become below the predetermined value, and therefore, the automatic erasing routine can be normally terminated, and a repetition of erase operation can be continuously executed. Furthermore, the present invention is capable of being used as a memory product where there can be some erase defective bits.

While the preferred embodiments of the invention have been described using specific terms, such description is for illustrative purposes only, and it is to be understood that changes and variations may be made without departing from the spirit or the scope of the following claims.

What is claimed is:

1. An erasing device of a storage unit comprising:

an erasing means repeatedly erasing memory cells of the storage unit; and a controlling means, terminating the memory cell erasure by said erasing means when a threshold value of each of a predetermined number of memory cells, said predetermined number being less than the number of memory cells in said storage unit, is smaller than a predetermined threshold value.

2. An erasing device of a storage unit as claimed in claim 1, comprising:

a selecting means for selecting said predetermined number of bits of said memory cells.

3. An erasing device of a storage unit as claimed in claim 2, wherein said selecting means is to select particular bit lines or particular word lines within said memory cells.

4. An erasing method of a storage unit, comprising the steps of:

repeatedly erasing memory cells of the storage unit; and controlling to terminate the memory cell erasure at said step of erasing when a threshold value of each of a predetermined number of memory cells, said predetermined number being less than the number of memory cells in said storage unit, is smaller than a predetermined threshold value.

5. An erasing method of a storage unit as claimed in claim 4, comprising the step of:

selecting said predetermined number of bits of said memory cells.

6. An erasing method of a storage unit as claimed in claim 5, wherein, at said step of selecting, particular bit lines or particular word lines within said memory cells are selected.

7. A storage medium storing a program, the program performing the following steps:

an erasing step for repeatedly erasing memory cells on a storage unit; and a controlling step for terminating the memory cell erasure by said erasing step when a threshold value of a predetermined number of memory cells, said predetermined number being less than the number of said memory cells in the storage unit, is smaller than a predetermined threshold value.

8. A storage medium storing a program, as claimed in claim 7, wherein a selecting process is executed for selecting said predetermined number of bits of said memory cells.

9. A storage medium storing a program, as claimed in claim 8, wherein said selecting process is executed for selecting particular bit lines or particular word lines within said memory cells.

* * * * *